United States Patent [19]

von Pentz

[11] Patent Number: 4,737,786
[45] Date of Patent: Apr. 12, 1988

[54] MEASUREMENT CIRCUIT SUPPRESSING VARIATIONS IN A DISPLAY USING AN ELECTRIC MEASUREMENT TRANSMITTER

[75] Inventor: Bernhard von Pentz, Kronberg, Fed. Rep. of Germany

[73] Assignee: VDO Adolf Schindling AG, Frankfurt am Main, Fed. Rep. of Germany

[21] Appl. No.: 879,643

[22] Filed: Jun. 27, 1986

[30] Foreign Application Priority Data

Jul. 12, 1985 [DE] Fed. Rep. of Germany ....... 3524886

[51] Int. Cl.$^4$ ............................................ G08C 19/04
[52] U.S. Cl. ......................... 340/870.17; 340/870.38; 340/57; 324/115; 307/545
[58] Field of Search ...................... 340/870.38, 870.17, 340/661, 663, 588, 57, 59, 521, 523–525, 513, 509–511, 506; 324/115; 364/557, 57, 59; 307/545, 542

[56] References Cited

U.S. PATENT DOCUMENTS 3,927,571 12/1975 Athey .............................. 340/870.38
4,575,711 3/1986 Suzuki et al. ........................ 340/661
4,638,304 1/1987 Kimura et al. ....................... 340/661

*Primary Examiner*—John W. Caldwell, Sr.
*Assistant Examiner*—Tyrone Queen
*Attorney, Agent, or Firm*—Martin A. Farber

[57] ABSTRACT

A measurement circuit is operative with an electric measurement transmitter, particularly an NTC-resistor (1), and an indicating instrument (3) which has a display which is dependent on a transmitter voltage of the measurement transmitter. The circuit is developed for the suppressing of variations in the display within a middle measurement range. For this purpose, the measurement circuit has a clamping circuit (10–19). The clamping circuit permits the indicating instrument to be acted on within a lower measurement range (up to 80° C.), up to a first limit transmitter voltage by a voltage, which is varied as a function of the transmitter voltage. In a middle measurement range (80° C. to 105° C.) between the first limit transmitter voltage and a second limit transmitter voltage, the clamping circuit feeds the indicating instrument (3) with a constant voltage, which is equal to the voltage present on the indicating instrument at the first limit transmitter voltage. In an upper measurement range (above 105° C.) the clamping circuit permits the indicating instrument (3) to be acted on by a voltage which is varied as a function of the transmitter voltage. In this connection the voltage at the indicating instrument changes suddenly when the second limit transmitter voltage is exceeded (at 105° C.).

6 Claims, 1 Drawing Sheet

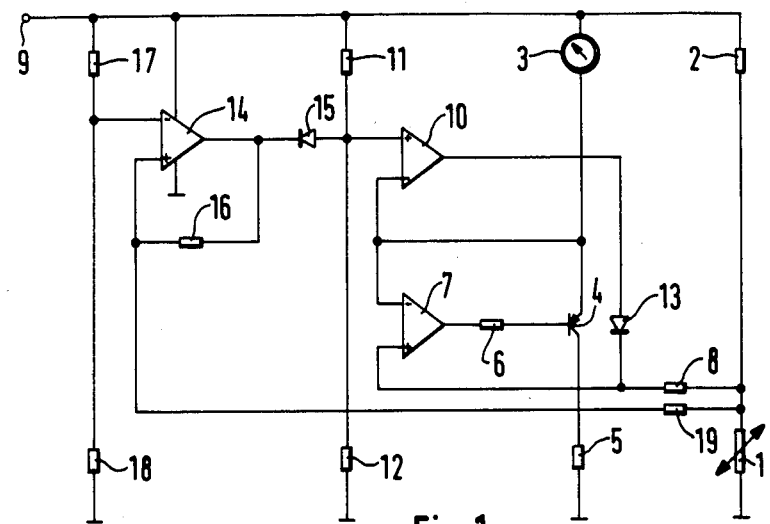
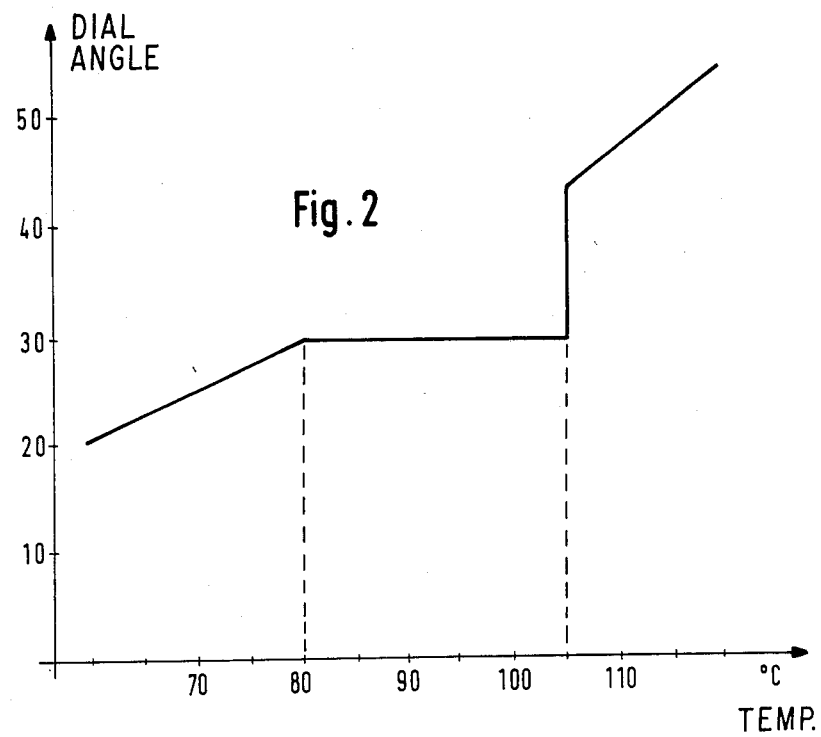

ues. Particularly when the measuring circuit is used to monitor the temperature of the cooling water of automobile internal combustion engines, the driver should therefore be advised as promptly as possible that the temperature of the cooling water is increasing from excessively low values into a normal middle measurement range and, in particular, a clear warning should be given if the middle measurement range is left because the temperature of the cooling water is assuming excessively high values.

MEASUREMENT CIRCUIT SUPPRESSING VARIATIONS IN A DISPLAY USING AN ELECTRIC MEASUREMENT TRANSMITTER

FIELD AND BACKGROUND OF THE INVENTION

The present invention relates to a measurement circuit for an electric measurement transmitter and an indicating instrument which has a display which is dependent on a transmitter voltage of the measurement transmitter, having means for suppressing variations of the display in a middle measurement range of the indicating instrument, particularly for monitoring the temperature of the cooling water of automobile internal combustion engines with a bimetallic indicating instrument and an NTC-resistor as measurement transmitter.

In known measurement circuits, a measurement transmitter, particularly an NTC-resistor (negative temperature coefficient resistor) arranged in series with an indicating instrument, is connected to a source of operating voltage. The NTC-resistor causes a current which varies in accordance with the ambient temperature of the NTC-resistor to pass through the indicating instrument, the current being relatively high when the temperature is high. By means of the indicating instrument a reading which is a function of the current or of the transmitter voltage on the NTC-resistor is obtained in a form of the deflection of a pointer.

If the cooling water temperature of an automotive internal combustion engine is to be monitored by the use of this measurement transmitter and the indicating instrument, it may be desirable to avoid indication of brief changes in temperature of the cooling water in operation since they occur even upon trouble-free operation of the automotive internal combustion engine, and might needlessly annoy the driver. On the other hand, the driver should be warned as soon as possible by a large deflection of the pointer should the temperature of the cooling water assume values which give reason to fear damage to the automotive internal combustion engine.

In order to attenuate undesired variations of the indication of the indicating instrument one could contemplate providing a relatively large damping within the indicating instrument itself or in the measurement circuit within which the indicating instrument is located. For example, the bimetallic indicating instruments generally used for the monitoring of the temperature of the cooling water already have substantial damping, which, however, is still not sufficient to adequately suppress the said large brief variations within a normal temperature range. Increasing the damping may not only result in increased expense for the storage of energy in the measurement circuit but, in particular, also result in a greatly delayed deflection of the pointer. It is important rapidly and clearly to indicate impermissibly high temperatures of the cooling water.

SUMMARY OF THE INVENTION

The object of the present invention is therefore so to improve a measuring circuit of the aforementioned type that the greatest possible suppression of variations in the temperature indication is obtained within a middle temperature range, while substantially undamped indication is obtained in a lower measurement range and, in particular, in an upper measurement range in which the temperature values measured assume questionable values. Particularly when the measuring circuit is used to monitor the temperature of the cooling water of automobile internal combustion engines, the driver should therefore be advised as promptly as possible that the temperature of the cooling water is increasing from excessively low values into a normal middle measurement range and, in particular, a clear warning should be given if the middle measurement range is left because the temperature of the cooling water is assuming excessively high values.

This objective is achieved by a development of the measurement circuit wherein the measurement circuit comprises a clamping circuit (10-19) which permits the indicating instrument (3) to be acted on in a lower measurement range (for instance up to 80° C.) up to a first limit transmitter voltage by a voltage which is varied as a function of the transmitter voltage, which in a middle measurement range (for instance 80° C. to 105° C.) between the first limit transmitter voltage and a second limit transmitter voltage feeds the indicating instrument with a constant voltage (clamping voltage) which is equal to the voltage present on the indicating instrument with the first limit transmitter voltage, and which permits the indicating instrument to be acted on in an upper measurement range (for instance above 105° C.) by a voltage which varies a function of the transmitter voltage, the voltage at the indicator instrument changing suddenly when the second limit transmitter voltage is exceeded (for instance at 105° C.).

In accordance with the invention, therefore, no further delay or intensified averaging of the transmitter voltage or of a voltage which tracks this transmitter voltage is provided which would cause a more sluggish indication. Rather, the measurement circuit suppresses the indication of the actual measured value and the voltage corresponding to it within the middle measurement range, producing instead of this a constant deflection of the pointer. This constant deflection corresponds to the measured value at the first limit of the transmitter voltage at which the lower measurement range passes into the middle measurement range. The indication in the middle measurement range is then independent of a further change with time of the transmitter voltage. The person observing the indicating instrument therefore merely notes within the middle measurement range that the operating condition monitored is working properly, and does not unnecessarily concern himself with unimportant changes.

Only if the measured value reaches the upper measurement range, namely when the second limit of the transmitter voltage is reached, is there again an indication of the actual measured values. Since this indication is given without additional delay, the person observing the indicating instrument can be reliably warned and kept advised as to the course of the critical measured value. An additional clear warning is given in the manner that, upon passing the second limit transmitter voltage, the indication suddenly jumps to the new value in the upper measurement range so that a clearly visible change in the indication is produced. Thus even a less attentive observer or an observer whose attention has been diverted is reliably warned.

When the measurement circuit is used for monitoring the temperature of the cooling water, the middle measurement range can advisedly extend from about 80° C. to 105° C. At 80° C. the first limit transmitter voltage occurs and at 105° C. the second limit transmitter voltage occurs. When an NTC-resistor is used as measurement transmitter, the first limit transmitter voltage is thus relatively large and the second limit transmitter voltage is relatively small. Conversely, there correspond respectively to this a relatively small and a relatively large tracking voltage at the indicating instrument since the NTC-resistor, which lies in series with an equivalent resistance—equal to the resistor of the indicating instrument—is connected to the source of operating voltage.

One advantage of the circuit in accordance with the invention resides also in the fact that no expensive storage means for the formation of the average value of the transmitter voltage need be provided.

The measurement circuit can be constructed inexpensively with three comparators, namely, that a first comparator (difference amplifier 7) is provided in which the transmitter voltage is compared with the tracking voltage which occurs on a controlled semiconductor (transistor 4) with respect to a fixed reference voltage (ground potential); that the clamping circuit (10-19) comprises a second comparator (second difference amplifier 10) in which the transmitter voltage is compared with a reference voltage which is set to the first limit transmitter voltage and which acts on the first comparator (first difference amplifier 7) with a clamping voltage which is held within the middle measurement range at the value of the first limit measurement voltage instead of the transmitter voltage, and that a third comparator (difference amplifier 14) is also part of the clamping circuit, the transmitter voltage being compared in said third comparator with a comparison voltage set to the second limit measurement voltage, and said third comparator disconnecting the clamping voltage from the first comparator (first difference amplifier 7) in the upper measurement range. In the foregoing three-comparator case the transmitter voltage serves to control the first comparator so as to produce with the latter, via a subsequent transistor, a voltage drop equal to the transmitter voltage in series with the indicating instrument. This voltage drop therefore represents a voltage which tracks the transmitter voltage. The second comparator forms the clamping voltage when a first predetermined limit transmitter voltage is exceeded. By the third comparator, the second comparator is placed out of action when a second limit transmitter voltage is exceeded, so that the clamping voltage is done away with and the first comparator again produces a voltage which tracks the transmitter voltage.

With this circuit, further advantageous details are provided by the fact that, within this circuit, an input of the first comparator (first difference amplifier 7) is acted on by the transmitter voltage via a decoupling resistor (8) and is coupled, for the connecting of the clamping voltage, via a first diode (13) to an output of the second comparator (second difference amplifier 10), and that the input of the second comparator (second difference amplifier 10) which is acted on by the reference voltage is coupled via a second diode (15) to an output of the third comparator (third difference amplifier 14) to disconnect the clamping voltage from the first comparator (first difference amplifier 7). The middle measurement range, in which the indication is held constant corresponding to the clamping voltage, can be precisely established substantially independently of variations in the ambient temperature. The diodes provided serve for the decoupling of the second comparator and the third comparator from the first and second comparators respectively but do not determine the limits of the middle measurement range.

The limits of the middle measurement range are, rather, determined by the reference voltage and the comparison voltage, which are produced in uncomplicated manner in by the fact that the reference voltage is formed at an input of the second comparator (second difference amplifier 10) and the comparison voltage is formed at an input of the third comparator (third difference amplifier 14), in each case by a voltage divider (11, 12 and 17, 18 respectively).

If the equivalent resistance in the series circuit with the measurement transmitter differs from the resistance of the indicating instrument which it is to replace in the series circuit, the tracking voltage can be changed by a constant factor with respect to the transmitter voltage. The selection of the equivalent resistance therefore permits adjustment of the indication outside the middle measureemnt range, within which the indication is constant.

BRIEF DESCRIPTION OF THE DRAWINGS

With the above and other objects and advantages in view, the present invention will become more clearly understood in connection with the detailed description of a preferred embodiment, when considered with the accompanying drawings, of which:

FIG. 1 is a wiring diagram of the measurement circuit; and

FIG. 2 shows the indication characteristic of the indicating instrument obtained with the circuit, namely the dial angle as a function of the temperature which is detected with an NTC-resistor.

DETAILED DESCRIPTION OF THE PREFERRED EMBODIMENT

In the circuit of FIG. 1, an NTC-resistor 1 is provided for measuring the temperature of cooling water. The resistor 1 serves as a measurement transmitter and is connected in series with an equivalent resistor 2 of an indicating instrument 3. The indicating instrument is constructed as a bimetallic indicating instrument.

In series with the indicating instrument 3 there is an emitter-collector path of a transistor 4, to which a series resistor 5 is connected in series. The series resistor provides, inter alia, protection of the transistor 4 and of the indicating instrument 3 should a short-circuit occur at the NTC-resistor 1 or its leads.

The base of the transistor 4 is controlled via a coupling resistor 6 from an output of a first difference amplifier 7. A positive input of the amplifier 7 of the difference amplifier 7 is connected via a decoupling resistor 8 to the NTC-resistor 1. A negative input is connected directly to the emitter of the transistor 4.

The circuit is fed by a source of operating voltage which is connected to a terminal 9 and to ground.

The above-described part of the circuit containing the first difference amplifier 7 operates in the manner that the voltage which drops at the emitter of the transistor 4 with respect to ground tracks the transmitter voltage at the NTC-resistor 1. If the equivalent resistor 2 is selected equal to the internal resistance of the indicating instrument 3, then a constant current therefore flows through the indicating instrument in the same way as through the equivalent resistor 2 and the NTC-resistor 1. This means that in a first measurement range, which extends up to 80° C. in FIG. 2, deflection of a pointer of the instrument 3 takes place in the same manner as though the indicating instrument 3 were connected in the customary manner in series with the NTC-resistor 1.

Above the temperature of 80° C., however, a second difference amplifier 10 is connected in the part of the circuit described above.

The second difference amplifier 10 normally receives at its positive input a reference voltage which corresponds to the divider ratio of series-connected resistors 11 and 12. At a negative input of the second difference amplifier 10 there is present the tracking voltage produced by the first difference amplifier 7 and the transistor 4.

The divider ratio of the resistors 11 and 12 is so adjusted that the voltage at the positive input of the second difference amplifier 10 is equal to the tracking voltage at the emitter of the transistor 4 if the temperature of 80° C. is reached and exceeded at the NTC-resistor. Upon the exceeding of this temperature, the tracking voltage at the negative input of the second difference amplfiier 10 becomes smaller than the reference voltage at the positive input thereof. Via a diode 13 which is now acted on in forward direction, the output voltage of the second difference amplifier 10 is imparted to the positive input of the first difference amplifier 7. This means that a clamping voltage at the positive input of amplifier 7 produces a correspondingly tracked voltage at the indicating instrument 3 as long as the transmitter voltage at the NTC-resistor 1 is less than the reference voltage on the positive input of the second difference amplifier 10 and as long as no additional part of the circuit still to be described enters into action. These conditions are satisified in the middle measurement range between 80°C. and 105°C. in Fig. 2, which accordingly represents a constant indication in this measurement range.

If the temperature in the NTC-resistor 1 exceeds 105° C., then a further part of the measurement circuit is activated. This part comprises essentially a third difference amplifier 14 whose output is connected, via a second diode 15, also to the positive input of the second difference amplifier 10. Furthermore the output of amplifier 14 is fed back via a resistor 16 to the positive input of the third difference amplifier 14. A voltage divider with resistors 17, 18 produces, by division of the operating voltage, a comparison voltage at a negative input of the third difference amplifier 14. The positive input of the third difference amplifier 14 is acted on, via a second decoupling resistor 19, by the transmitter voltage on the NTC-resistor 1, even if the clamping voltage acts on the circuit part containing the first difference amplifier 7.

With a transmitter voltage which is comparatively large at temperatures below 105° C. as compared with the comparison voltage at the negative input of the third difference amplifier 14, a high potential is produced at the output of this differential amplifier 7, and this potential blocks the diode 15. The circuit containing the first difference amplifier 7 and the second difference amplifier 10 therefore operates in the manner described above, without being influenced by the third difference amplifier 14.

However, as soon as the temperature in the NTC-resistor 1 exceeds 105° C. and accordingly the transmitter voltage drops below the comparison voltage, the potential at the output of the third difference amplifier 14 becomes approximately zero and the diode 15 conducts, the potential at the positive terminal of the second difference amplifier 10 also dropping to approximately zero. As a result, the potential at the output of the second difference amplifier drops in such a manner that the diode 13 blocks, i.e. the clamping voltage disappears. The part of the circuit containing the first difference amplifier 9 again operates uninfluenced, as described above. This means that the voltage at the indicating instrument increases suddenly to the value at which it tracks the transmitter voltage as if no clamping voltage were present. In addition, the tracking of the voltage at the indicating instrument 3 takes place in a manner unaffected by the clamping voltage as long as the temperature remains in the upper measurement range above 105° C.

I claim:

1. In a measurement circuit for an electric measurement transmitter generating a transmitter voltage and an indicating instrument which has a display dependent on said transmitter voltage of, the measurement circuit suppressing variations of the display in a middle measurement range of said indicating instrument, particularly for monitoring the temperature of the cooling water of automobile internal combustion engines wherein said indicating instrument is a bimetallic indicating instrument, there being an NTC-resistor to serve as the measurement transmitter; the improvement wherein the measurement circuit comprises a first comparator having differential amplifier means for driving the indicating instrument in a lower measurement range up to a first limit transmitter voltage and in an upper measurement range above a second limit transmitter voltage in response to the transmitter voltage;

a second comparator having comparator means and clamping means for clamping the transmitter voltage during a middle measurement range between said first limit transmitter voltage and said second transmitter voltage resulting in a feeding of the indicating instrument with a constant clamped voltage which is equal to the first limit transmitter voltage, said second comparator being operative by comparing the transmitter voltage with a first reference voltage which is set to the first limit transmitter voltage for applying to the first comparator a clamping voltage to constrain the transmitter voltage; and a third comparator having comparator means and means for unclamping the clamped voltage in said upper measurement range above said second limit transmitter voltage by comparing the transmitter voltage with a second reference voltage set to the second limit measurement voltage.

2. A measurement circuit according to claim 1, wherein said differential amplifier means of said first comparator further comprises:

a controlled semiconductor providing a tracking voltage to said display, the tracking voltage being connected to an input of said first comparator for tracking the transmitter voltage within a range fixed by the first reference voltage.

3. A measurement circuit according to claim 2, further comprising:

a decoupling resistor connected between said measurement transmitter and a second input of said first comparator; and wherein said clamping means comprises a first diode connected to said input of said first comparator, and said unclamping means comprises a second diode; and said second input of said first comparator is acted on by the transmitter voltage via said decoupling resistor and is coupled, for the connecting of the clamping voltage, via said first diode to an output of said second comparator; and wherein an input of said second comparator is acted on by the first reference voltage and is coupled via said second diode to an output of said third comparator to disconnect the clamping voltage from said first comparator.

4. A circuit according to claim 2, wherein each of said second and said third comparators includes a difference amplifier.

5. A measurement circuit according to claim 2, further comprising a first voltage divider and a second voltage divider; and wherein the first reference voltage is formed at an input of said second comparator by said first voltage divider, and the second reference voltage is formed at an input of said third comparator by said second voltage divider.

6. A measurement circuit according to claim 1, further comprising an equivalent resistor; and wherein the measurement transmitter is connected in series with said equivalent resistor, the resistance of which resistor is selected for adjusting an indicating characteristic which may be selected to a selected resistance value including the internal resistance of the indicating instrument and alternatively a resistance value different from said internal resistance.

* * * * *